(12) United States Patent
Ban et al.

(10) Patent No.: US 8,507,082 B2
(45) Date of Patent: Aug. 13, 2013

(54) CVD COATED POLYCRYSTALLINE C-BN CUTTING TOOLS

(75) Inventors: Zhigang Ban, Latrobe, PA (US); Yixiong Liu, Greensburg, PA (US)

(73) Assignee: Kennametal Inc., Latrobe, PA (US)

(*) Notice: Subject to any disclaimer, the term of this patent is extended or adjusted under 35 U.S.C. 154(b) by 129 days.

(21) Appl. No.: 13/072,359

(22) Filed: Mar. 25, 2011

(65) Prior Publication Data

US 2012/0244342 A1 Sep. 27, 2012

(51) Int. Cl.
*B32B 9/00* (2006.01)

(52) U.S. Cl.
USPC ............... 428/325; 51/307; 51/309; 428/336; 428/698; 428/701; 428/702

(58) Field of Classification Search
USPC .................. 51/307, 309; 428/325, 336, 698, 428/701, 702
See application file for complete search history.

(56) References Cited

U.S. PATENT DOCUMENTS

| | | |
|---|---|---|
| 4,343,651 A | 8/1982 | Yazu et al. |
| 4,880,755 A | 11/1989 | Mehrotra |
| 4,911,756 A | 3/1990 | Nakai et al. |
| 5,228,812 A | 7/1993 | Noguchi et al. |
| 5,328,875 A | 7/1994 | Ueda et al. |
| 5,330,853 A | 7/1994 | Hofmann et al. |
| 5,372,873 A | 12/1994 | Yoshimura et al. |
| 5,374,471 A | 12/1994 | Yoshimura et al. |
| 5,478,634 A | 12/1995 | Setoyama et al. |
| 5,487,625 A | 1/1996 | Ljungberg et al. |
| 5,503,913 A | 4/1996 | Konig et al. |
| 5,525,134 A | 6/1996 | Mehrotra et al. |
| 5,597,272 A | 1/1997 | Moriguchi et al. |
| 5,624,766 A | 4/1997 | Moriguchi et al. |
| 5,635,247 A | 6/1997 | Ruppi |
| 5,676,496 A | 10/1997 | Littecke et al. |
| 5,700,551 A | 12/1997 | Kukino et al. |
| 5,707,185 A | 1/1998 | Mizutani |
| 5,712,030 A | 1/1998 | Goto et al. |
| 5,715,030 A | 2/1998 | Quaresima |
| 5,722,803 A | 3/1998 | Battaglia et al. |
| 5,833,021 A | 11/1998 | Mensa-Wilmot et al. |
| 5,853,268 A | 12/1998 | Simpson |
| 5,853,873 A | 12/1998 | Kukino et al. |
| 5,861,210 A | 1/1999 | Lenander et al. |
| 5,863,640 A | 1/1999 | Ljungberg et al. |

(Continued)

FOREIGN PATENT DOCUMENTS

| | | |
|---|---|---|
| EP | 0102843 A2 | 3/1984 |
| EP | 0834486 A2 | 4/1998 |

(Continued)

OTHER PUBLICATIONS

Osada et al "wear mechanism of thermally tranformed CVD Al2O3 layer" International Journal of Refractory Metals & Hard Materials 24 (2006) p. 387-391.*

(Continued)

*Primary Examiner* — Archene Turner
(74) *Attorney, Agent, or Firm* — Matthew W. Gordon, Esq.

(57) ABSTRACT

In one aspect, the present invention provides coated cutting tools comprising a PcBN substrate wherein a layer of single phase $\alpha$-alumina is deposited by chemical vapor deposition directly on one or more surfaces of the substrate.

20 Claims, 7 Drawing Sheets

(56) References Cited

U.S. PATENT DOCUMENTS

| | | | |
|---|---|---|---|
| 5,879,823 | A | 3/1999 | Prizzi et al. |
| 5,882,777 | A | 3/1999 | Kukino et al. |
| 5,948,716 | A | 9/1999 | Kume et al. |
| 5,981,416 | A | 11/1999 | Kume et al. |
| 6,001,757 | A | 12/1999 | Fukaya et al. |
| 6,045,440 | A | 4/2000 | Johnson et al. |
| 6,090,476 | A | 7/2000 | Thysell et al. |
| 6,140,262 | A | 10/2000 | Collier et al. |
| 6,265,337 | B1 | 7/2001 | Kukino et al. |
| 6,377,152 | B1 | 4/2002 | Shikama et al. |
| 6,599,062 | B1 | 7/2003 | Oles et al. |
| 6,635,593 | B1 | 10/2003 | Kukino et al. |
| 6,716,544 | B2 | 4/2004 | Uesaka et al. |
| 6,737,178 | B2 | 5/2004 | Ota et al. |
| 6,884,496 | B2 | 4/2005 | Westphal et al. |
| 7,081,424 | B2 | 7/2006 | Okamura et al. |
| 7,163,735 | B2 * | 1/2007 | Ruppi ............ 428/325 |
| 7,393,263 | B2 | 7/2008 | Okada et al. |
| 7,442,431 | B2 * | 10/2008 | Ruppi ............ 428/698 |
| 7,442,432 | B2 * | 10/2008 | Ruppi ............ 428/336 |
| 7,455,918 | B2 * | 11/2008 | Gates et al. ........ 428/701 |
| 7,476,063 | B2 | 1/2009 | Wickman et al. |
| 7,531,213 | B2 | 5/2009 | Bjormander |
| 7,670,980 | B2 | 3/2010 | Dahl |
| 7,695,764 | B2 * | 4/2010 | Ruppi ............ 427/255.34 |
| 7,736,733 | B2 * | 6/2010 | Itoh et al. ........ 428/325 |
| 8,323,807 | B2 * | 12/2012 | Kohara et al. ........ 428/698 |
| 2003/0104254 | A1 | 6/2003 | Westphal et al. |
| 2005/0123366 | A1 | 6/2005 | Goudemond et al. |
| 2006/0127671 | A1 | 6/2006 | Park et al. |
| 2006/0204757 | A1 | 9/2006 | Ljungberg |
| 2006/0257690 | A1 | 11/2006 | Bjormander |
| 2007/0009763 | A1 | 1/2007 | Littecke et al. |
| 2007/0298281 | A1 | 12/2007 | Andersson et al. |
| 2007/0298282 | A1 | 12/2007 | Andersson et al. |
| 2008/0107882 | A1 | 5/2008 | Littecke et al. |
| 2009/0214894 | A1 | 8/2009 | Kohara et al. |
| 2010/0255345 | A1 | 10/2010 | Ban et al. |

FOREIGN PATENT DOCUMENTS

| | | |
|---|---|---|
| EP | 0879806 A1 | 11/1998 |
| EP | 0974566 A1 | 1/2000 |
| EP | 1498199 A1 | 1/2005 |
| EP | 1717348 A2 | 11/2006 |
| JP | 01-96083 | 4/1989 |
| JP | 01-096084 | 4/1989 |
| JP | 08-126903 | 5/1994 |
| JP | 07-172919 | 7/1995 |
| JP | 07-328814 | 12/1995 |
| JP | 09-011006 | 1/1997 |
| JP | 2000-044370 | 2/2000 |
| JP | 2000247746 | 9/2000 |
| WO | 9304015 | 3/1993 |
| WO | 9404316 | 3/1994 |
| WO | 2004105983 A1 | 12/2004 |
| WO | 2006046125 A1 | 5/2006 |

OTHER PUBLICATIONS

Moltrecht, Single-Point Cutting Tools and Performance, Machine Shop Practice, Second Edition, 1981, pp. 199-204, Industrial Press Inc., New York, NY.

Merchant, Principles of Metal Cutting and Machinability, Section 17, Tool Engineer's Handbook, 1949, pp. 302-315.

American Standard, ANSI B212.4-2002 for Cutting Tools—Indexable Inserts—Identification System, Sponsor Cemented Carbide Producer's Association (2002).

* cited by examiner

CVD COATED POLYCRYSTALLINE C-BN CUTTING TOOLS

FIELD OF THE INVENTION

The present invention relates to cutting tools having coatings applied by chemical vapor deposition (CVD) and, in particular, to CVD coated polycrystalline cubic boron nitride (PcBN) cutting tools.

BACKGROUND OF THE INVENTION

Cutting tools have been used in both coated and uncoated conditions for machining various metals and alloys. In order to increase cutting tool wear resistance and lifetime, one or more layers of refractory materials have been applied to cutting tool surfaces. TiC, TiCN, TiOCN, TiN and $Al_2O_3$, for example, have been applied to cemented carbide substrates by CVD.

$Al_2O_3$ or alumina has been of particular interest as a coating for cutting tools. Alumina demonstrates various crystalline phases including $\alpha$, $\kappa$, $\gamma$, $\beta$ AND $\theta$ with the $\alpha$ and $\kappa$ phases occurring most frequently on CVD coated cemented carbide cutting tools. $\alpha$-alumina has proven to be a desirable coating given its thermodynamic stability and general chemical inertness at various temperatures encountered in cutting applications. However, deposition of $\alpha$-alumina is increasingly difficult and often sensitive to deposition conditions and the chemical identity of the cutting tool substrate. Prior literature, for example, has demonstrated the requirement to sufficiently oxidize titanium carbide surfaces prior to alumina deposition in order to induce formation of the $\alpha$-phase. Insufficient oxidation of TiC surfaces results in the production of $\kappa$-alumina or a mixture of $\kappa$ and $\alpha$ phases (see e.g., Vourinen, S., *Thin Solid Films*, 193/194 (1990) 536-546 and Layyous et al., *Surface and Coatings Technology*, 56 (1992) 89-95).

Moreover, $\alpha$-alumina coatings on cemented carbide substrates have displayed significant adhesion problems leading to premature coating failure by delamination and other degradative pathways. Adhesion problems in $\alpha$-alumina coatings on cemented carbides has been attributed to significant interfacial porosity developed between the coating and substrate during $\alpha$-alumina deposition (see e.g., Chatfield et al., *Journal de Physique*, Coloque C5, supplement au n° 5, Tome 50, mai 1989).

In view of these findings, $\alpha$-alumina bonding layers have been extensively researched and developed. The bonding layers are provided on surfaces of cemented carbide substrates to ensure the nucleation and growth of $\alpha$-alumina and to mitigate or eliminate the development of interfacial porosity (see e.g., Halvarsson et al., *Surface and Coatings Technology*, 68/69 (1994) 266-273 and Halvarsson et al., *Surface and Coatings*
Technology 76/77 (1995) 287-296).

Cutting tools based on polycrystalline cubic boron nitride (PcBN) are becoming more popular given the high hardness and high thermal stability (up to about 980° C.) of cBN. PcBN cutting tools, for example, find application in machining case-hardened and through-hardened steels, superalloys, chilled cast iron and gray cast iron. Additionally, PcBN based cutting tools are operable to run dry for clean machining processes thereby saving coolant, maintenance and disposal costs.

Similar to cemented carbides, cutting tools based on PcBN substrates can also benefit from the application of various refractory coatings. PcBN cutting tool substrates, for example, have been provided with TiCN, TiOCN, TiN and $Al_2O_3$ coatings. Nevertheless, as with cemented carbides, the deposition of $\alpha$-alumina on PcBN cutting tool substrates occurs through the use of one or more intervening layers over the substrate, including bonding or modification layers. U.S. Pat. No. 7,455,918 to Gates et al. discloses PcBN cutting tools wherein $\alpha$-alumina is deposited on modification layers residing between the PcBN substrate and the $\alpha$-alumina layer.

SUMMARY

In view of the foregoing, the present invention, in one aspect, provides coated cutting tools comprising a PcBN substrate wherein a layer of single phase $\alpha$-alumina is deposited by chemical vapor deposition directly on one or more surfaces of the substrate. In some embodiments, a coated cutting tool described herein comprises a substrate comprising greater than 80 weight percent PcBN and a coating adhered to the substrate, the coating comprising a layer of single phase $\alpha$-$Al_2O_3$ deposited by chemical vapor deposition directly on a surface of the substrate. In some embodiments, the layer of single phase $\alpha$-$Al_2O_3$ deposited directly on a surface of the substrate comprising greater than 80 weight percent PcBN has a critical load ($L_c$) of greater than 70 N.

Moreover, in some embodiments, a coating of a cutting tool described herein further comprises one or more layers of $MO_xO_nN_z$ deposited over the single phase $\alpha$-$Al_2O_3$ layer, wherein M is a metal selected from the group consisting of metallic elements of Groups IVB, VB and VIB of the Periodic Table and x+y+z=1. In some embodiments, one or more layers of $MC_xO_yN_z$ are deposited over the single phase $\alpha$-$Al_2O_3$ layer by CVD or physical vapor deposition (PVD).

In another aspect, methods of producing coated cutting tools are described herein. In some embodiments, a method of producing a coated cutting tool comprises providing a cutting tool substrate comprising greater than 80 weight percent PcBN and depositing directly on a surface of the substrate by chemical vapor deposition a layer of single phase $\alpha$-$Al_2O_3$. In some embodiments, a method of producing a coated cutting tool further comprises depositing a one or more layers of $MO_xO_nN_z$ over the single phase $\alpha$-$Al_2O_3$ layer, wherein M is a metal selected from the group consisting of metallic elements of Groups IVB, VB and VIB of the Periodic Table and x+y+z=1. In some embodiments, one or more layers of $MO_xC_yN_z$ are deposited by CVD or PVD.

In another aspect, methods of cutting metal are described herein. In some embodiments, a method of cutting metal comprises providing a metal work piece and cutting the metal work piece with a coated cutting tool, the coated cutting tool comprising a substrate comprising greater than 80 weight percent PcBN and a coating adhered to the substrate, the coating comprising a layer of single phase $\alpha$-$Al_2O_3$ deposited by chemical vapor deposition directly on a surface of the substrate. In some embodiments, the coating of the cutting tool further comprises one or more layers of $MO_xC_yN_z$ deposited over the single phase $\alpha$-$Al_2O_3$ layer as described herein.

These and other embodiments are described in greater detail in the detailed description which follows.

DETAILED DESCRIPTION

Figure 1:
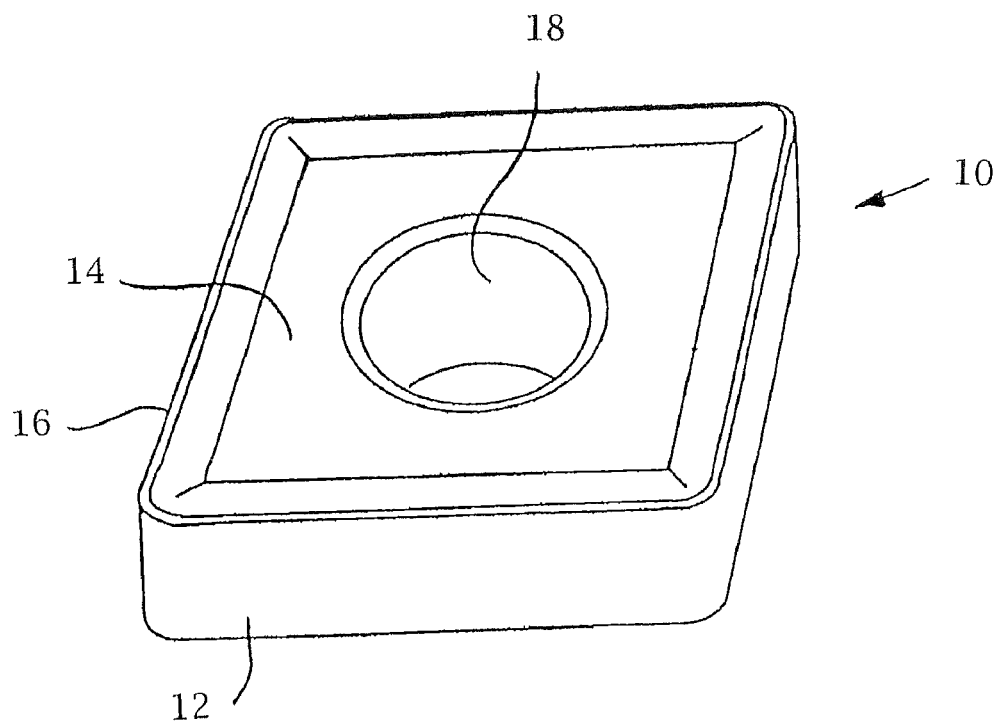
FIG. 1 illustrates a substrate of a coated cutting tool according to one embodiment described herein.

Embodiments described herein can be understood more readily by reference to the following detailed description and examples and their previous and following descriptions. Elements, apparatus and methods described herein, however, are not limited to the specific embodiments presented in the detailed description and examples. It should be recognized that these embodiments are merely illustrative of the principles of the present invention. Numerous modifications and adaptations will be readily apparent to those of skill in the art without departing from the spirit and scope of the invention.

In one aspect, the present invention provides coated cutting tools comprising a PcBN substrate wherein a layer of single phase α-alumina is deposited by chemical vapor deposition directly on one or more surfaces of the substrate. In some embodiments, a coated cutting tool described herein comprises a substrate comprising greater than 80 weight percent PcBN and a coating adhered to the substrate, the coating comprising a layer of single phase α-$Al_2O_3$ deposited by chemical vapor deposition directly on a surface of the substrate.

Turning now to components of a coated cutting tool described herein, a coated cutting tool described herein comprises a PcBN substrate. PcBN substrates of coated cutting tools described herein comprise greater than 80 weight percent PcBN. In some embodiments, for example, a substrate of a coated cutting tool comprises at least about 85 weight percent PcBN. A substrate of a coated cutting tool, in some embodiments, comprises at least about 90 weight percent PcBN. In some embodiments, a substrate comprises at least about 95 weight percent PcBN.

In some embodiments, a substrate of a coated cutting tool described herein comprises PcBN in an amount ranging from greater than 80 weight percent to about 97 weight percent. A substrate, in some embodiments, comprises PcBN in an amount ranging from about 85 weight percent to about 95 weight percent.

In some embodiments, a substrate comprises a ceramic or metallic binder in addition to the PcBN. Suitable ceramic binders for use in a substrate of a coated cutting tool described herein, in some embodiments, comprise nitrides, carbonitrides, carbides and/or borides of titanium, tungsten, cobalt or aluminum. In some embodiments, for example, a substrate comprises a binder of AlN, $AlB_2$ or mixtures thereof. In some embodiments, a suitable metallic binder for PcBN substrates comprises cobalt. Moreover, in some embodiments, a substrate can comprise solid solutions of any of the foregoing ceramic or metallic binders.

Compositional determination of a PcBN substrate described herein can be conducted by X-ray diffraction (XRD). The cutting tool substrate rake face or flank face can be analyzed depending on cutting tool geometry. For compositional phase analysis of a PcBN substrate described herein, both a PANalytical Xpert MRD diffraction system fitted with a Eulerean cradle and microfocus optics for PcBN compacts and tips, or a PANalytical Xpert MPD fitted with programmable optics for analysis of a monolithic solid piece of PcBN can be used.

Both x-ray diffraction systems are configured with focusing beam optics and fitted with a copper x-ray tube and operating parameters of 45 KV and 40 MA. For analysis of the monolithic solid piece, the PANalytical MRD is fitted with programmable divergence slit and programmable antiscatter slit. The x-ray beam width is controlled by an appropriate mask size and x-ray beam length is fixed at 2 mm using the programmable optics. The PANalytical MPD is fitted with a linear strip solid state x-ray detector and nickel beta filter.

The PANalytical Xpert MRD system is configured with a microfocus monocapillary optics of either 100μ or 500μ focal spot depending on size of PcBN compact. The PANalytical MRD is fitted with a linear strip solid state x-ray detector and nickel beta filter.

Analysis scan range, counting times, and scan rate are selected to provide optimal data for Rietveld analysis. A background profile is fitted and peak search is performed on the PcBN substrate diffraction data to identify all peak positions and peak intensities. The peak position and intensity data is used to identify the crystal phase composition of the PcBN substrate using any of the commercially available crystal phase databases.

Crystal structure data is input for each of the crystalline phases present in the substrate. Typical Rietveld refinement parameters settings are:
Sample Geometry: Flat Plate
Linear Absorption Coefficient: Calculated from average specimen composition
Weighting Scheme: Against Iobs
Profile Function: Pseudo-Voight
Profile Base Width: Chosen per specimen
Least Squares Type: Newton-Raphson
Polarization Coefficient: 1.0

The Rietveld refinement typically includes:
Specimen Displacement: shift of specimen from x-ray alignment
Background profile selected to best describe the background profile of the diffraction data
Scale Function: scale function of each phase
B overall: displacement parameter applied to all atoms in phase
Cell parameters: a, b, c and alpha, beta, and gamma
W parameter: describes peak FWHM
Any additional parameter to achieve an acceptable goodness of fit PcBN substrates having compositional parameters described herein can be provided in various constructions. In some embodiments, for example, a coated cutting tool comprises a monolithic solid piece PcBN substrate. In some embodiments, a PcBN substrate is provided as a compact or insert attached to a support by brazing or other joining technique. In some embodiments, a PcBN substrate is a full top cutting insert on a support.

FIG. 1 illustrates a monolithic solid piece PcBN substrate of a coated cutting tool according to one embodiment described herein. The PcBN substrate (10) comprises a flank surface (12) and a rake surface (14), wherein the flank (12) and rake (14) surfaces intersect to provide a cutting edge (16). The substrate also comprises an aperture (18) operable to secure the substrate (10) to a tool holder.

Figure 2:
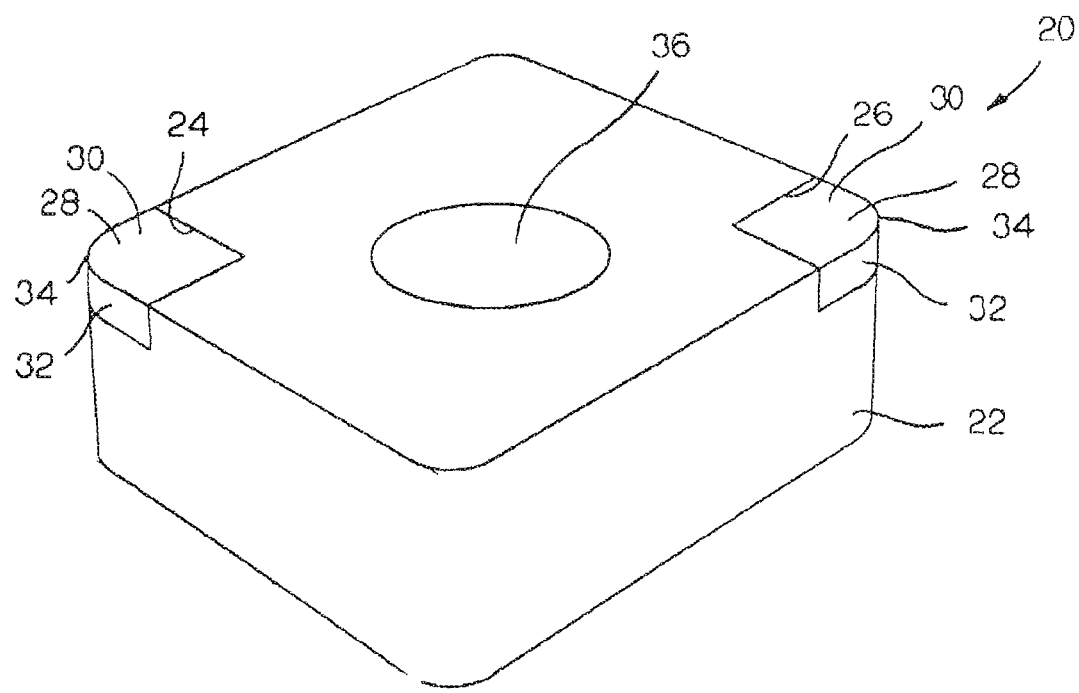
FIG. 2 illustrates a substrate of a coated cutting tool according to one embodiment described herein.

FIG. 2 illustrates a PcBN substrate of a coated cutting tool according to one embodiment wherein the PcBN substrate is provided as a compact or insert joined to a support by brazing or other technique. As illustrated in FIG. 2, the cutting tool (20) comprises a support (22) having notches (24, 26) in opposing corners of the support (22). In some embodiments, the support (22) comprises a metal carbide, such as tungsten carbide with a cobalt binder. A PcBN substrate (28) is provided as a compact or insert which affixes by brazing or other technique within each of the notches (24, 26). The PcBN substrate (28) has a rake surface (30) and at least one flank surface (32). A cutting edge (34) is formed at the juncture of the rake surface (30) and at least one flank surface (32). The cutting tool in the embodiment of FIG. 2 further comprises an aperture (36), which can assist the connection of the cutting tool (20) to a tool holder.

Figure 3:
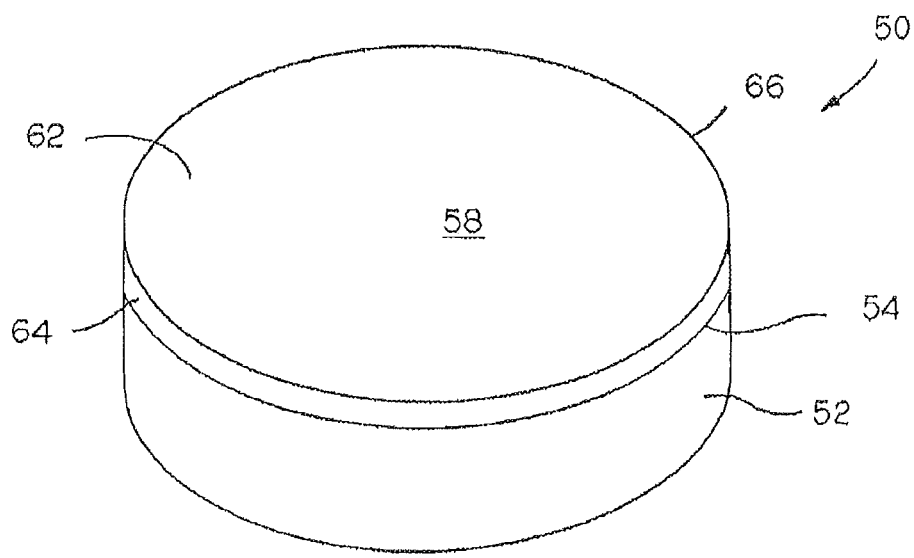
FIG. 3 illustrates a substrate of a coated cutting tool according to one embodiment described herein.

FIG. 3 illustrates a PcBN substrate of a coated cutting tool according to one embodiment wherein the PcBN substrate is provided as an insert on the top surface of a support. As illustrated in FIG. 3, the cutting tool (50) comprises a support (52) having a top surface (54). In some embodiments, for example, the support (52) comprises a metal carbide such as a tungsten carbide with a cobalt binder. The PcBN substrate (58) couples to the top surface (54) of the support (52) by brazing or other joining technique. The PcBN substrate (58) comprises a rake surface (62) and at least one flank surface (64), wherein a cutting edge (66) is formed at the juncture of the rake surface (62) and at least one flank surface (64).

As described herein, a coating adhered to the PcBN substrate comprises a layer of single phase $\alpha$-$Al_2O_3$ deposited by chemical vapor deposition directly on the surface of the PcBN substrate. In being deposited directly on one or more surfaces of the PcBN substrate, the layer of single phase $\alpha$-$Al_2O_3$ does not reside on a modification layer, bonding layer or any other intervening layer.

In some embodiments, the layer of single phase $\alpha$-$Al_2O_3$ has a thickness of at least about 2 µm. In some embodiments, the layer of single phase $\alpha$-$Al_2O_3$ has a thickness of at least about 5 µm. The layer of single phase $\alpha$-$Al_2O_3$, in some embodiments, has a thickness of at least about 10 µm or at least about 15 µm.

In some embodiments, a layer of single phase $\alpha$-$Al_2O_3$ deposited directly on a surface of the PcBN substrate has a thickness ranging from about 2 µm to about 20 µm. In some embodiments, the layer of single phase $\alpha$-$Al_2O_3$ has a thickness ranging from about 5 µm to about 15 µm. The layer of single phase $\alpha$-$Al_2O_3$, in some embodiments, has a thickness ranging from about 3 µm to about 10 µm.

In some embodiments, the layer of single phase $\alpha$-$Al_2O_3$ has an average grain size ranging from about 0.2 µm to about 5 µm. In some embodiments, the layer of single phase $\alpha$-$Al_2O_3$ has an average grain size ranging from about 0.5 µm to about 2 µm. In some embodiments, the layer of single phase $\alpha$-$Al_2O_3$ has an average grain size ranging from about 1 µm to about 3 µm. Grain size of a single phase $\alpha$-$Al_2O_3$ layer described herein can be determined by taking a top down SEM image of the $\alpha$-$Al_2O_3$ layer at a magnification of 5000×. A line is drawn on the SEM image in a random direction, and the grain size is calculated by the following formula:

Grain size = $L/(N-1)$ wherein L is the length of the line, and N is the number of grain boundaries intersected by the line. The foregoing measurement is repeated for five (5) SEM images of the $\alpha$-$Al_2O_3$ layer, and the resulting grain size values are averaged to provide the average grain size.

In some embodiments, grains of the single phase $\alpha$-$Al_2O_3$ layer display a columnar structure. Moreover, in some embodiments, grains at the surface of the single phase $\alpha$-$Al_2O_3$ layer display a polyhedral morphology.

In some embodiments, grains at the surface of the single phase $\alpha$-$Al_2O_3$ layer display a shape having an aspect ratio of at least 2 in a plane parallel to the surface of the $\alpha$-$Al_2O_3$ layer. Aspect ratio, as used herein, refers to the length of the grain in a plane parallel to the surface of the $\alpha$-$Al_2O_3$ layer divided by the width of the grain in a plane parallel to the surface of the $\alpha$-$Al_2O_3$ layer. In some embodiments, grains at the surface of the $\alpha$-$Al_2O_3$ layer have an aspect ratio of at least 5 or at least 10. In some embodiments, grains at the surface of the $\alpha$-$Al_2O_3$ layer have an aspect ratio ranging from about 2 to about 20 or from about 5 to about 15. In some embodiments, grains at the surface of the $\alpha$-$Al_2O_3$ layer have an aspect ratio ranging from about 2 to about 10.

Figure 5:
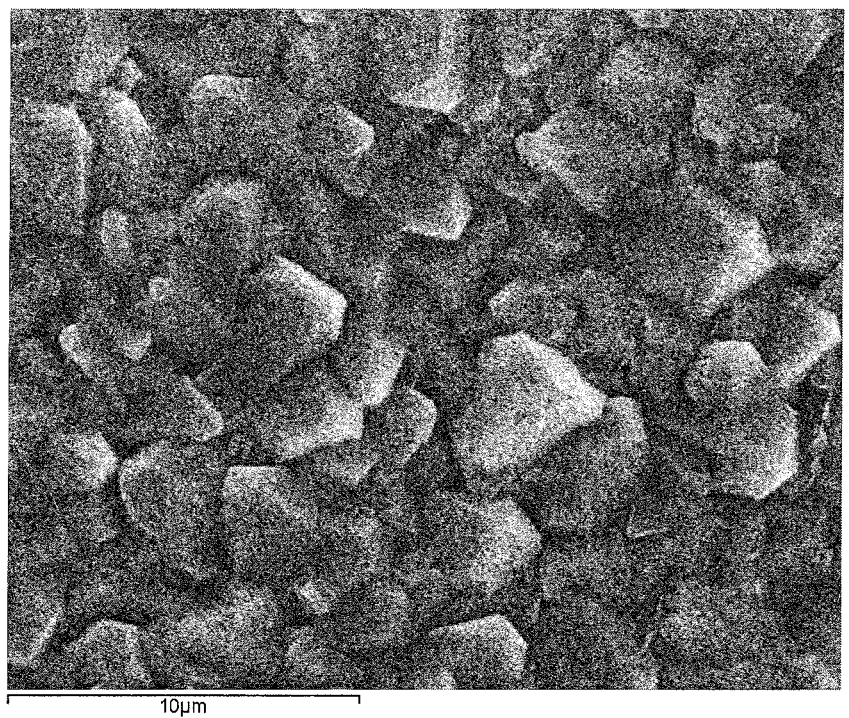
FIG. 5 illustrates a top down scanning electron micrograph (SEM) of a single phase α-$Al_2O_3$ layer of a coated cutting tool according to one embodiment described herein.
Figure 7:
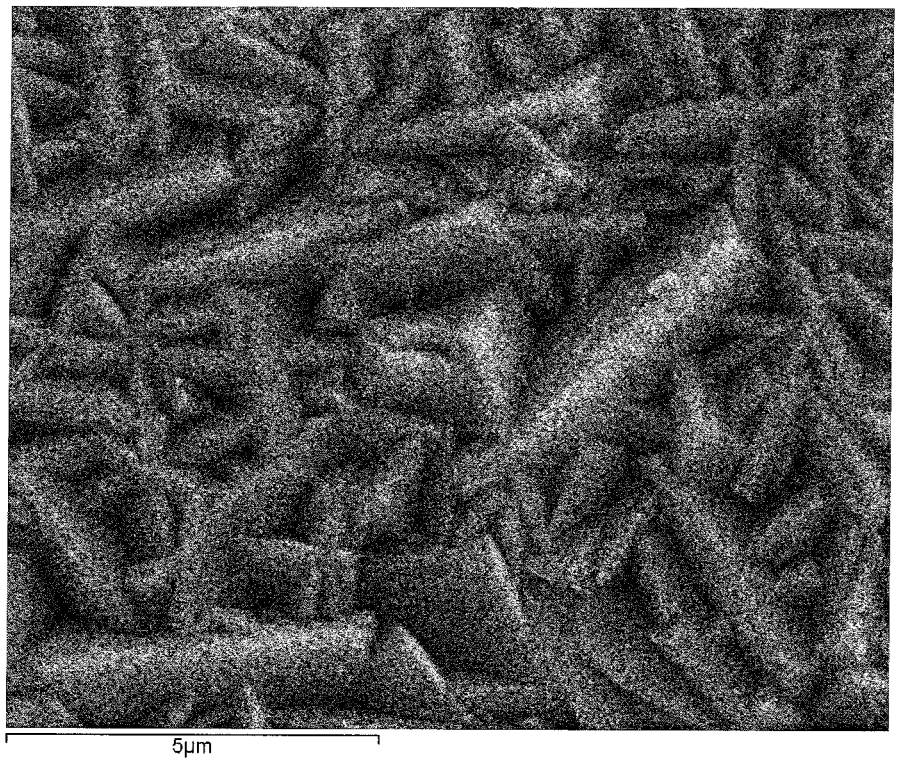
FIG. 7 illustrates a top down SEM of a single phase α-$Al_2O_3$ layer of a coated cutting tool according to one embodiment described herein.

In some embodiments, grain morphology at a surface of the single phase $\alpha$-$Al_2O_3$ layer can be determined by taking a top down SEM of the surface at a magnification of 5000×. FIGS. 5 and 7 discussed further herein provide SEMs from which grain morphology at the surface of the single phase $\alpha$-$Al_2O_3$ layer can be discerned.

In some embodiments, a coating of a cutting tool described herein further comprises one or more layers of $MO_xO_nN_z$ deposited over the single phase $\alpha$-$Al_2O_3$ layer, wherein M is a metal selected from the group consisting of metallic elements of Groups IVB, VB and VIB of the Periodic Table and x+y+z=1. In some embodiments, M is selected from the group consisting of Ti, Zr and Hf. In some embodiments, for example, a layer of TiN is deposited over the single phase $\alpha$-$Al_2O_3$ layer. In some embodiments, a layer of TiCN or TiOCN is deposited over the single phase $\alpha$-$Al_2O_3$ layer. In some embodiments, one or more layers of $MO_xC_yN_z$ are deposited over the single phase $\alpha$-$Al_2O_3$ layer by CVD or physical vapor deposition (PVD).

In some embodiments, one or more layers of $MO_xO_nN_z$ can have any thickness not inconsistent with the objectives of the present invention. In some embodiments, a layer of $MO_xC_yN_z$ has a thickness of at least about 0.5 µm. In some embodiments, a layer of $MO_xC_yN_z$ has a thickness ranging from about 0.5 µm to about 5 µm or from about 1 µm to about 3 µm.

In some embodiments wherein one or more layers of $MO_xO_nN_z$ are deposited over the single phase $\alpha$-$Al_2O_3$ layer, the $MO_xC_yN_z$ layer(s) can be etched away to expose a surface of the single phase $\alpha$-$Al_2O_3$ layer for SEM analysis of grain morphology.

A coating comprising a single phase $\alpha$-$Al_2O_3$ layer in direct contact with a PcBN cutting tool substrate described herein and an optional $MO_xC_yN_z$ layer deposited over the $\alpha$-$Al_2O_3$ layer, in some embodiments, demonstrates a critical load ($L_c$) greater than 60 N or greater than 65 N. In some embodiments, the coating has a critical load ($L_c$) greater than 70 N. $L_c$ values for coatings recited herein were determined according to ASTM C1624-05—Standard Test for Adhesion Strength by Quantitative Single Point Scratch Testing wherein a progressive loading rate of 10 N/mm was used.

In some embodiments, a coating comprising a single phase $\alpha$-$Al_2O_3$ layer in direct contact with a PcBN cutting tool substrate described herein and an optional $MO_xC_yN_z$ layer deposited over the $\alpha$-$Al_2O_3$ layer has modulus (E) of at least about 390 GPa. In some embodiments, the coating has a modulus of at least about 400 GPa. In some embodiments, the coating has a modulus ranging from about 380 GPa to about 420 GPa.

In some embodiments, a coating comprising a single phase $\alpha$-$Al_2O_3$ layer in direct contact with a PcBN cutting tool substrate described herein and an optional $MO_xC_yN_z$ layer deposited over the $\alpha$-$Al_2O_3$ layer has a nanohardness of at least about 20 GPa. In some embodiments, the coating has a nanohardness of at least about 24 GPa. The coating, in some embodiments, has a nanohardness ranging from about 15 GPa to about 30 GPa or from about 20 GPa to about 25 GPa.

Coating modulus and nanohardness values recited herein were determined from nano-indentation testing conducted with a Fischerscope HM2000 in accordance with ISO standard 14577 using a Vickers indenter. Indentation depth was set to 0.25 μm.

In another aspect, methods of producing coated cutting tools are described herein. In some embodiments, a method of producing a coated cutting tool comprises providing a cutting tool substrate comprising greater than 80 weight percent PcBN and depositing directly on a surface of the substrate by chemical vapor deposition a layer of single phase α-$Al_2O_3$. In some embodiments, a method of producing a coated cutting tool further comprises depositing a one or more layers of $MO_xC_yN_z$ over the single phase α-$Al_2O_3$ layer, wherein M is a metal selected from the group consisting of metallic elements of Groups IVB, VB and VIB of the Periodic Table and x+y+z=1. In some embodiments, one or more layers of $MO_xC_yN_z$ are deposited by CVD or PVD.

In some embodiments of methods described herein, a cutting tool substrate can comprise any PcBN content recited herein for the substrate. Moreover, in some embodiments of methods described herein, the single phase α-$Al_2O_3$ layer can comprise any of the compositional, chemical and/or physical properties recited hereinabove for a single phase α-$Al_2O_3$ layer. Additionally, in some embodiments, one or more layers of $MO_xC_yN_z$ can comprise any of the compositional, chemical and/or physical properties recited hereinabove for a $MO_xC_yN_z$ layer.

In some embodiments, depositing a layer of single phase α-$Al_2O_3$ directly on a surface of the PcBN substrate comprises varying the rate at which the α-$Al_2O_3$ is deposited. In some embodiments, varying the rate at which the α-$Al_2O_3$ is deposited comprises transitioning from a lower rate of α-$Al_2O_3$ deposition to a higher rate of α-$Al_2O_3$ deposition. In some embodiments, a higher rate of α-$Al_2O_3$ deposition is 1.5× greater than a lower rate of α-$Al_2O_3$ deposition. In some embodiments, varying the rate at which the α-$Al_2O_3$ is deposited comprises transitioning from a higher rate of α-$Al_2O_3$ deposition to a lower rate of α-$Al_2O_3$ deposition.

In some embodiments, depositing a layer of single phase α-$Al_2O_3$ directly on a surface of the PcBN substrate comprises varying the deposition temperature of the α-$Al_2O_3$. Varying the deposition temperature, in some embodiments comprises transitioning from a higher α-$Al_2O_3$ deposition temperature to a lower α-$Al_2O_3$ deposition temperature. In some embodiments, the difference between the higher α-$Al_2O_3$ deposition temperature and the lower α-$Al_2O_3$ deposition temperature is at least 50° C. In some embodiments, the difference between the higher α-$Al_2O_3$ deposition temperature and the lower α-$Al_2O_3$ deposition temperature is at least 130° C. In some embodiments, the difference between the higher α-$Al_2O_3$ deposition temperature and the lower α-$Al_2O_3$ deposition temperature ranges from about 50° C. to about 150° C. In some embodiments, the difference between the higher α-$Al_2O_3$ deposition temperature and the lower α-$Al_2O_3$ deposition temperature ranges from about 50° C. to about 130° C. In some embodiments, transitioning from a higher α-$Al_2O_3$ deposition temperature to a lower α-$Al_2O_3$ deposition temperature comprises transitioning from high temperature (HT) α-$Al_2O_3$ deposition to medium temperature (MT) α-$Al_2O_3$ deposition.

Alternatively, in some embodiments, varying the deposition temperature comprises transitioning from a lower deposition temperature to a higher deposition temperature.

In some depositing a layer of single phase α-$Al_2O_3$ directly on a surface of the PcBN substrate comprises varying the deposition rate and deposition temperature of the α-$Al_2O_3$ as described hereinabove.

In another aspect, methods of cutting metal are described herein. In some embodiments, a method of cutting metal comprises providing a metal work piece and cutting the metal work piece with a coated cutting tool, the coated cutting tool comprising a substrate comprising greater than 80 weight percent PcBN and a coating adhered to the substrate, the coating comprising a layer of single phase α-$Al_2O_3$ deposited by chemical vapor deposition directly on a surface of the substrate. In some embodiments, the coating of the coated cutting tool further comprises one or more layers of $MO_xC_yN_z$ deposited over the single phase α-$Al_2O_3$ layer as described herein.

In some embodiments, metal cutting with a coated cutting tool described herein is conducted dry, in the absence of any liquids and/or lubricants. In some embodiments, a metal work piece is selected from the group consisting of gray cast iron, case-hardened and through-hardened steels, superalloys and chilled cast iron.

These and other embodiments are further illustrated by the following non-limiting examples.

EXAMPLE 1

Coated Cutting Tool Body

A coated cutting tool described herein was produced by placing a monolithic solid piece substrate (ANSI Catalog No. SNM433S0820) comprising PcBN in an amount of 90 weight percent with the balance AlN/$AlB_2$ binder in a CVD apparatus having an axial feed configuration. A layer of single phase α-$Al_2O_3$ was deposited directly on a surface of the PcBN substrate according to the process parameters provided in Table I.

TABLE I

| | CVD Deposition of α-$Al_2O_3$ Directly on PcBN Cutting Tool Substrate | | | | | | | |
|---|---|---|---|---|---|---|---|---|
| Process Step | Temp. (° C.) | Pressure (mbar) | Time (min) | $H_2$ (vol. %) | $AlCl_3$ (vol. %) | $CO_2$ (vol. %) | HCl (vol. %) | $H_2S$ (vol. %) |
| Etching | 980-1000 | 60-200 | 10-50 | balance | 0.5-2.0 | — | — | — |
| $Al_2O_3$ Deposition | 980-1000 | 60-200 | 10-50 | balance | 0.1-1.0 | 0.2-1.2 | 0.2-1.0 | — |
| $Al_2O_3$ Deposition | 980-1000 | 60-200 | 5-60 | balance | 0.5-1.5 | 0.7-2.2 | 0.7-2.0 | — |
| $Al_2O_3$ Deposition | 980-1000 | 60-200 | 5-60 | balance | 0.5-1.5 | 0.7-2.2 | 0.7-2.0 | 0.01-0.08 |
| $Al_2O_3$ Deposition | 980-1000 | 60-200 | 120-600 | balance | 0.5-2.5 | 1.5-4.0 | 1.0-3.0 | 0.1-0.4 |

The deposited single phase α-Al$_2$O$_3$ layer had a thickness of 7.2 μM. A TiN top layer of 1.5 μm was subsequently deposited over the single phase α-Al$_2$O$_3$ layer by standard CVD techniques.

Figure 4:
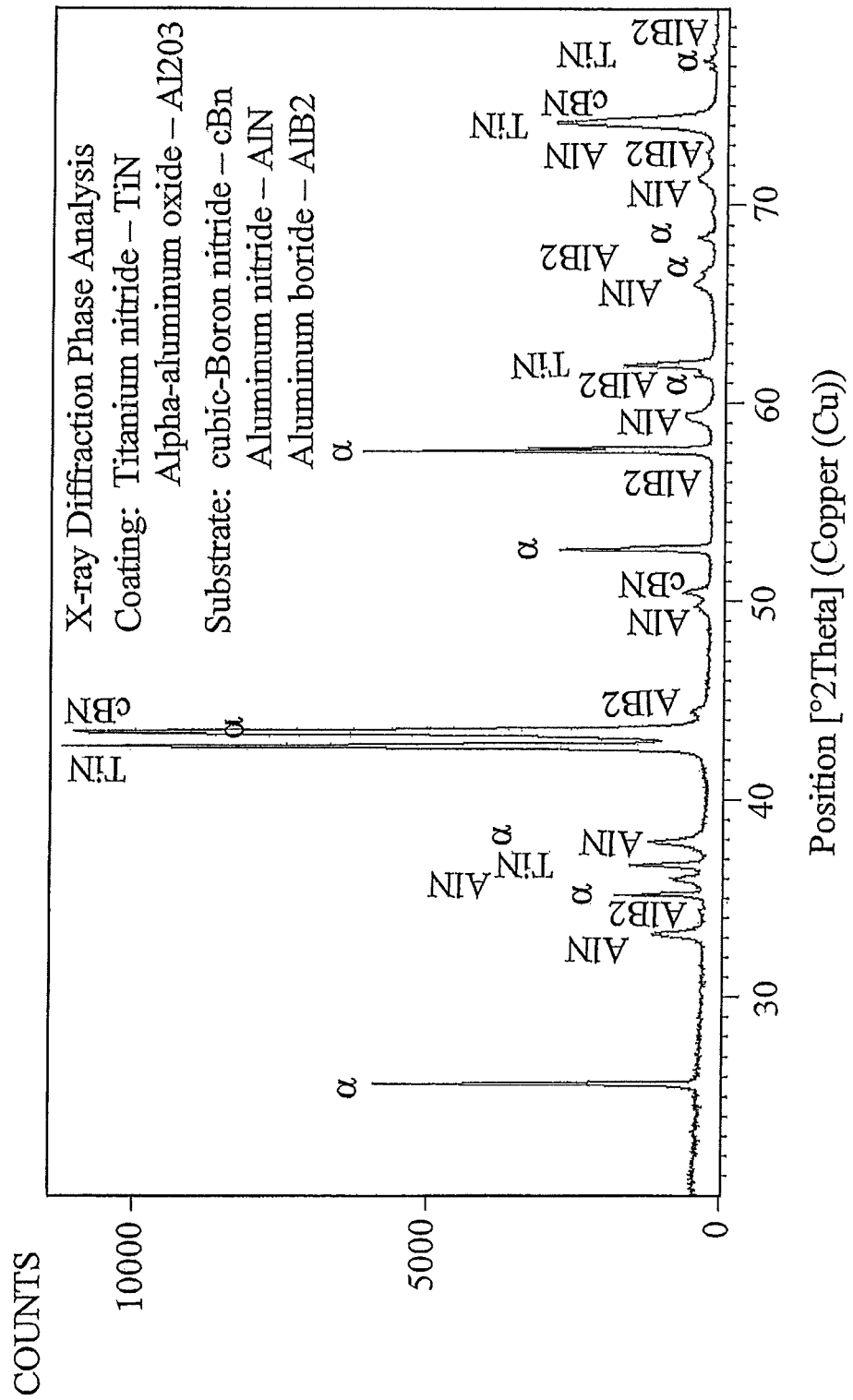
FIG. 4 illustrates an X-ray diffractogram of a coated cutting tool according to one embodiment described herein.

FIG. 4 illustrates an X-ray diffractogram of the coated cutting tool. As provided by the diffractogram, Al$_2$O$_3$ deposited directly on surfaces of the PcBN cutting tool substrate in the present Example was single phase α-Al$_2$O$_3$. The α-Al$_2$O$_3$/TiN coating demonstrated an adhesion of greater than 70 N, a nanohardness of 24.2 GPa and a modulus of 406 GPa.

Moreover, FIG. 5 illustrates a top down scanning electron micrograph (SEM) of the coated cutting tool taken at a magnification of 3000× subsequent to removal of the top TiN layer by etching. Grains at the surface of the single phase α-Al$_2$O$_3$ layer displayed a polyhedral morphology.

EXAMPLE 2

Coated Cutting Tool Body

A coated cutting tool described herein was produced by placing a monolithic solid piece substrate (ANSI Catalog No. SNM433S0820) comprising PcBN in an amount of 90 weight percent with the balance AlN/AlB$_2$ binder in a CVD apparatus having an axial feed configuration. A layer of single phase α-Al$_2$O$_3$ was deposited directly on a surface of the PcBN substrate according to the process parameters provided in Table II.

TABLE II

CVD Deposition of α-Al$_2$O$_3$ Directly on PcBN Cutting Tool Substrate

| Process Step | Temp. (° C.) | Pressure (mbar) | Time (min) | H$_2$ (vol. %) | AlCl$_3$ (vol. %) | CO$_2$ (vol. %) | HCl (vol. %) | H$_2$S (vol. %) |
|---|---|---|---|---|---|---|---|---|
| Etching | 980-1000 | 60-200 | 10-50 | balance | 0.5-2.0 | — | — | — |
| Al$_2$O$_3$ Deposition | 980-1000 | 60-200 | 10-50 | balance | 0.1-1.0 | 0.2-1.2 | 0.2-1.0 | — |
| Al$_2$O$_3$ Deposition | 980-1000 | 60-200 | 5-60 | balance | 0.5-1.5 | 0.7-2.2 | 0.7-2.0 | — |
| Al$_2$O$_3$ Deposition | 980-1000 | 60-200 | 5-60 | balance | 0.5-1.5 | 0.7-2.2 | 0.7-2.0 | 0.01-0.08 |
| Al$_2$O$_3$ Deposition | 870-890 | 60-200 | 5-100 | balance | 0.7-2.0 | 1.0-2.5 | 1.0-3.5 | 0.1-0.4 |
| Al$_2$O$_3$ Deposition | 870-890 | 60-200 | 120-600 | balance | 1.0-3.0 | 4.0-10.0 | 1.0-3.5 | 0.1-0.4 |

The deposited single phase α-Al$_2$O$_3$ layer had a thickness of 9.9 μm. A TiN top layer of 0.6 μm was subsequently deposited over the single phase α-Al$_2$O$_3$ layer by standard CVD techniques.

Figure 6:
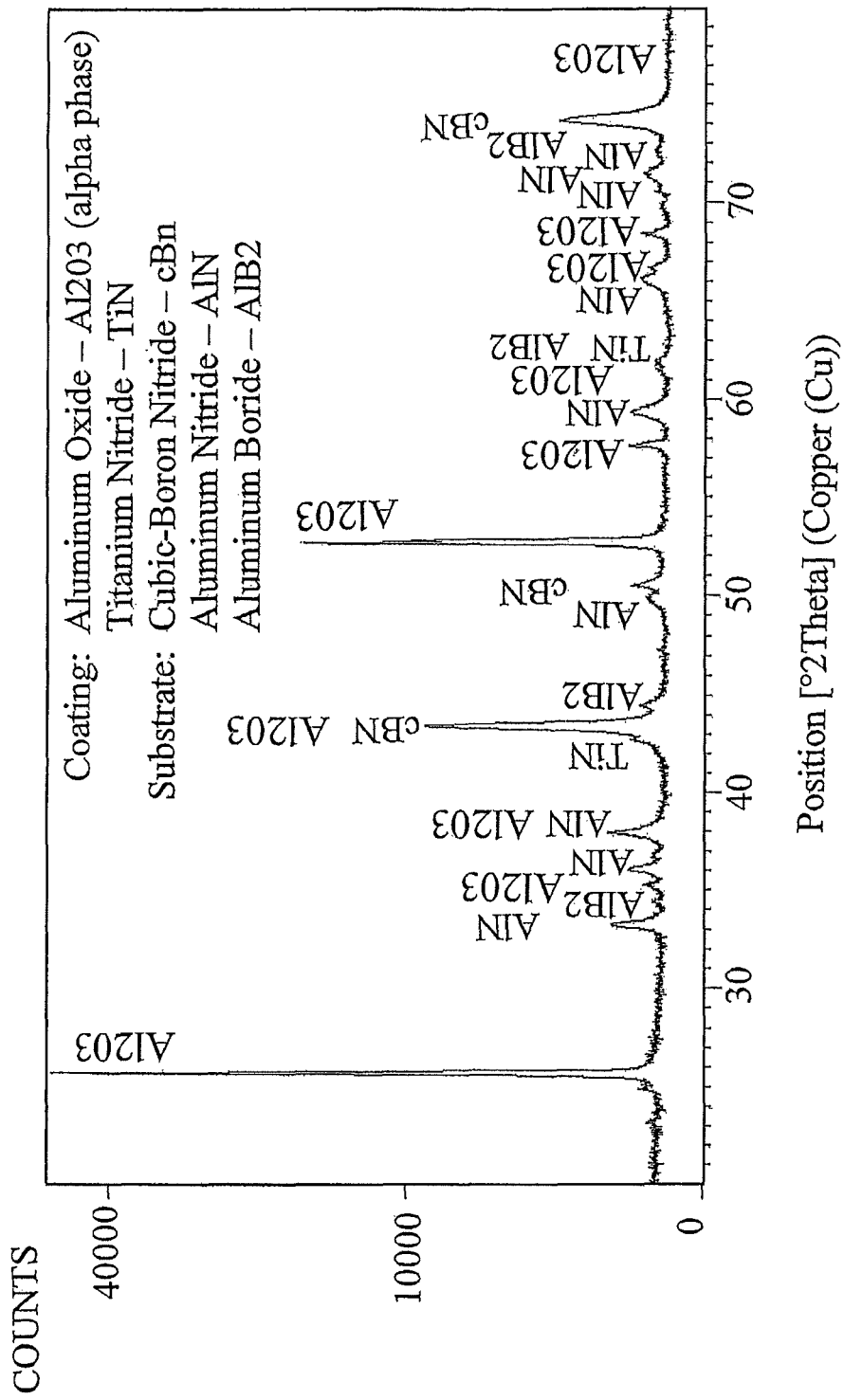
FIG. 6 illustrates an X-ray diffractogram of a coated cutting tool body according to one embodiment described herein.

FIG. 6 illustrates an X-ray diffractogram of the coated cutting tool. As provided by the diffractogram, Al$_2$O$_3$ deposited directly on surfaces of the PcBN cutting tool substrate in the present Example was single phase α-Al$_2$O$_3$. The α-Al$_2$O$_3$/TiN coating demonstrated an adhesion of greater than 70 N, a nanohardness of 26.2 GPa and a modulus of 390 GPa.

Moreover, FIG. 7 illustrates a top down scanning electron micrograph (SEM) of the coated cutting tool taken at a magnification of 5000× subsequent to removal of the top TiN layer by etching. Grains at the surface of the single phase α-Al$_2$O$_3$ layer displayed an aspect ratio consistent with those described hereinabove.

EXAMPLE 3

Cutting Tool Lifetime

Coated cutting tools described herein were subjected to cutting lifetime testing in comparison with prior art coated cutting tools. Non-limiting embodiments of coated cutting tools of the present invention A, B and C were produced in accordance with Example 1 above. Non-limiting embodiments of coated cutting tools of the present invention D and E were prepared in accordance with Example 2 above. Compositional parameters of coated cutting tools A-E and coated cutting tools of the prior art F, G and H are provided in Table III.

TABLE III

Coating Compositional Parameters

| Coated Cutting Tool | Substrate | Coating |
|---|---|---|
| A | PcBN (90 wt. %); AlN/AlB$_2$ binder (balance) | α-Al$_2$O$_3$/TiN |
| B | PcBN (90 wt. %); AlN/AlB$_2$ binder (balance) | α-Al$_2$O$_3$/TiN |
| C | PcBN (90 wt. %); AlN/AlB$_2$ binder (balance) | α-Al$_2$O$_3$/TiN |

TABLE III-continued

Coating Compositional Parameters

| Coated Cutting Tool | Substrate | Coating |
|---|---|---|
| D | PcBN (90 wt. %); AlN/AlB$_2$ binder (balance) | α-Al$_2$O$_3$/TiN |
| E | PcBN (90 wt. %); AlN/AlB$_2$ binder (balance) | α-Al$_2$O$_3$/TiN |
| F | PcBN (90 wt. %); AlN/AlB$_2$ binder (balance) | Al$_2$O$_3$ (0.5 μm)/TiN (0.5 μm)/TiCN (1.5 μm)/Al$_2$O$_3$ (4 μm)/TiCN—TiN (2 μm) |
| G | PcBN (90 wt. %); AlN/AlB$_2$ binder (balance) | Al$_2$O$_3$ (0.5 μm)/TiN (0.5 μm)/TiCN (1.5 μm)/Al$_2$O$_3$ (4 μm)/TiCN—TiN (2 μm) |
| H | PcBN (90 wt. %); AlN/AlB$_2$ binder (balance) | Al$_2$O$_3$ (0.5 μm)/TiN (0.5 μm)/TiCN (1.5 μm)/Al$_2$O$_3$ (4 μm)/TiCN—TiN (2 μm) |

Coated cutting tools A and F were subjected to cutting lifetime testing as follows:
Work piece—Class 40 G2 gray cast iron
Cutting Speed—2000 sfm
Feed Rate—0.009 ipr
Depth of Cut—0.025 inch
DRY
Coated cutting tools B, D and G were subjected to cutting lifetime testing as follows:
Work piece—Class 40 G2 gray cast iron
Cutting Speed—3000 sfm
Feed Rate—0.009 ipr
Depth of Cut—0.025 inch
DRY
Coated cutting tools C, E and H were subjected to cutting lifetime testing as follows:
Work piece—Class 40 G2 gray cast iron
Cutting Speed—3500 sfm
Feed Rate—0.009 ipr
Depth of Cut—0.025 inch
DRY
The results of the cutting tool lifetime testing are provided in Table IV.

TABLE IV

Coated Cutting Tool Lifetime Results

| Cutting Speed | Coated Cutting Tool | Lifetime (minutes) |
|---|---|---|
| 2000 sfm | A | 14.2 |
| 2000 sfm | F* | 12.1 |
| 3000 sfm | B | 8.6 |
| 3000 sfm | D | 9.2 |
| 3000 sfm | G* | 6.7 |
| 3500 sfm | C | 5.9 |
| 3500 sfm | E | 7.2 |
| 3500 sfm | H* | 2.6 |

*Prior Art Cutting Tools

As provided in Table IV, cutting tools having an architecture described herein (A-E) demonstrated significant increases in lifetime at all cutting speeds in comparison with the prior art coated cutting tools (F-H). Coated cutting tool E of the present invention, for example, displayed a 177% increase in cutting lifetime at a cutting speed of 3500 sfm in comparison with prior art cutting tool H.

Various embodiments of the invention have been described in fulfillment of the various objects of the invention. It should be recognized that these embodiments are merely illustrative of the principles of the present invention. Numerous modifications and adaptations thereof will be readily apparent to those skilled in the art without departing from the spirit and scope of the invention.

That which is claimed is:

1. A coated cutting tool comprising:
a substrate comprising greater than 80% weight percent polycrystalline cubic boron nitride (PcBN); and
a coating adhered to the substrate, the coating comprising a layer of single phase $\alpha$-$Al_2O_3$ deposited by chemical vapor deposition directly on a surface of the substrate, wherein the coating has a critical load ($L_c$) of greater than 65 N.

2. The coated cutting tool of claim 1, wherein the substrate comprises at least 90 weight percent PcBN.

3. The coated cutting tool of claim 1, wherein the layer of single phase $\alpha$-$Al_2O_3$ has a thickness of at least about 2 μm.

4. The coated cutting tool of claim 1, wherein the layer of single phase $\alpha$-$Al_2O_3$ has a thickness ranging from about 2 μm to about 20 μm.

5. The coated cutting tool of claim 1, wherein the layer of single phase $\alpha$-$Al_2O_3$ has an average grain size ranging from about 0.2 μm to about 5 μm.

6. The coated cutting tool of claim 1, wherein the layer of single phase $\alpha$-$Al_2O_3$ has an average grain size ranging from about 0.5 μm to about 2 μm.

7. The coated cutting tool of claim 1, wherein grains at the surface of the single phase $\alpha$-$Al_2O_3$ layer display a polyhedral morphology.

8. The coated cutting tool of claim 1, wherein grains at the surface of the single phase $\alpha$-$Al_2O_3$ layer have an aspect ratio greater than about 2 in a plane arallel to the surface.

9. The coated cutting tool of claim 1, wherein the coating has a critical load ($L_c$) greater than 70 N.

10. The coated cutting tool of claim 1, wherein the coating further comprises a layer of $MO_xC_yN_z$ deposited by chemical vapor deposition over the single phase $\alpha$-$Al_2O_3$ layer, wherein M is a metal selected from the group consisting of metallic elements of Groups IVB, VB and VIB of the Periodic Table and x+y+z=1.

11. The coated cutting tool of claim 1, wherein the coating has a nanohardness of at least about 23 GPa.

12. The coated cutting tool of claim 1, wherein the coating has a modulus of at least about 380 GPa.

13. The coated cutting tool of claim 1, wherein the coating has a thickness of 2-20 μm.

14. A coated cutting tool comprising:
a substrate comprising greater than 80% weight percent polycrystalline cubic boron nitride (PcBN); and
a coating adhered to the substrate, the coating comprising a layer of single phase $\alpha$-$Al_2O_3$ deposited by chemical vapor deposition directly on a surface of the substrate, wherein grains at the surface of the single phase $\alpha$-$Al_2O_3$ have an aspect ratio of at least 5 in a plane parallel to the surface.

15. The coated cutting tool of claim 14, wherein the aspect ratio is at least 10.

16. The coated cutting tool of claim 14, wherein the coating has a critical load ($L_c$) greater than 70 N.

17. The coated cutting tool of claim 14, wherein the coating has a thickness of 2-20 μm.

18. The coated cutting tool of claim 14, wherein the coating has a nanohardness of at least about 23 GPa.

19. The coated cutting tool of claim 14, wherein the coating has a modulus of at least about 380 GPa.

20. The coated cutting tool of claim 14, wherein the coating further comprises a layer of $MO_xC_yN_z$ deposited by chemical vapor deposition over the single phase $\alpha$-$Al_2O_3$ layer, wherein M is a metal selected from the group consisting of metallic elements of Groups IVB, VB and VIB of the Periodic Table and x+y+z=1.

* * * * *